US005576644A

United States Patent [19]
Pelella

[11] Patent Number: 5,576,644
[45] Date of Patent: *Nov. 19, 1996

[54] FAST EDGE TRIGGERED SELF-RESETTING CMOS RECEIVER WITH PARALLEL L1/L2 (MASTER/SLAVE) LATCH

[75] Inventor: Antonio R. Pelella, Highland Falls, N.Y.

[73] Assignee: International Business Machines Corporation, Armonk, N.Y.

[ * ] Notice: The term of this patent shall not extend beyond the expiration date of Pat. No. 5,465,060.

[21] Appl. No.: 459,874

[22] Filed: Jun. 2, 1995

Related U.S. Application Data

[62] Division of Ser. No. 257,852, Jun. 10, 1994, Pat. No. 5,465,060.

[51] Int. Cl.$^6$ .................................................. H03K 5/153
[52] U.S. Cl. ............................... 327/51; 327/52; 327/57; 327/202
[58] Field of Search .............................. 327/51–57, 206, 327/208, 212, 215, 198–203; 365/189.05, 189.07, 207

[56] References Cited

U.S. PATENT DOCUMENTS

| | | | |
|---|---|---|---|
| 3,609,569 | 9/1971 | Todd. | |
| 4,542,309 | 9/1985 | Klein et al.. | |
| 4,614,885 | 9/1986 | Brosch et al.. | |
| 4,908,794 | 3/1990 | Yamaguchi | 365/189.08 |
| 4,970,406 | 11/1990 | Fitzpatrick et al. | 307/272.1 |
| 4,972,414 | 11/1990 | Borkenhagen et al.. | |
| 5,041,740 | 8/1991 | Smith. | |
| 5,155,383 | 10/1992 | Barbera. | |
| 5,200,649 | 4/1993 | Fukui. | |
| 5,204,560 | 4/1993 | Bredin et al. | 307/530 |
| 5,239,506 | 8/1993 | Dachtera et al.. | |
| 5,258,950 | 11/1993 | Murashima et al. | 365/189.08 |
| 5,347,175 | 9/1994 | Lang et al. | 327/91 |
| 5,373,469 | 12/1994 | Akioka et al. | 365/189.05 |
| 5,400,285 | 3/1995 | Sakata | 365/205 |
| 5,465,060 | 11/1995 | Pelella | 327/51 |

OTHER PUBLICATIONS

"A 2-ns Cycle, 3.8-ns Access 512-kb CMOS ECL SRAM with a Fully Pipelined Architecture"; Terry I. Chappell et al.; IEEE 1991; pp. 1377–1385 (with 3 sheets of drawings consisting of 3 figures).

*Primary Examiner*—Timothy P. Callahan
*Assistant Examiner*—T. Lam
*Attorney, Agent, or Firm*—Whitham, Curtis, Whitham & McGinn; Lynn L. Augspurger

[57] ABSTRACT

A high speed self-resetting, edge-triggered CMOS (SRC-MOS) receiver and parallel L1/L2 latch combination are provided which may be used to receive and latch data from a single-ended input of static random access memory (SRAM) or a dynamic random access memory (DRAM). The invention comprises a true/complement generator circuit (TCG) for generating a data and its complement from a single-ended input, a reset circuit for automatically resetting the TCG independent of the system clock, and a parallel L1/L2 latch for storing the data for further processing. The L1/L2 latch preferably has scan-in and scan-out ports useful for testing and diagnostic purposes.

7 Claims, 5 Drawing Sheets

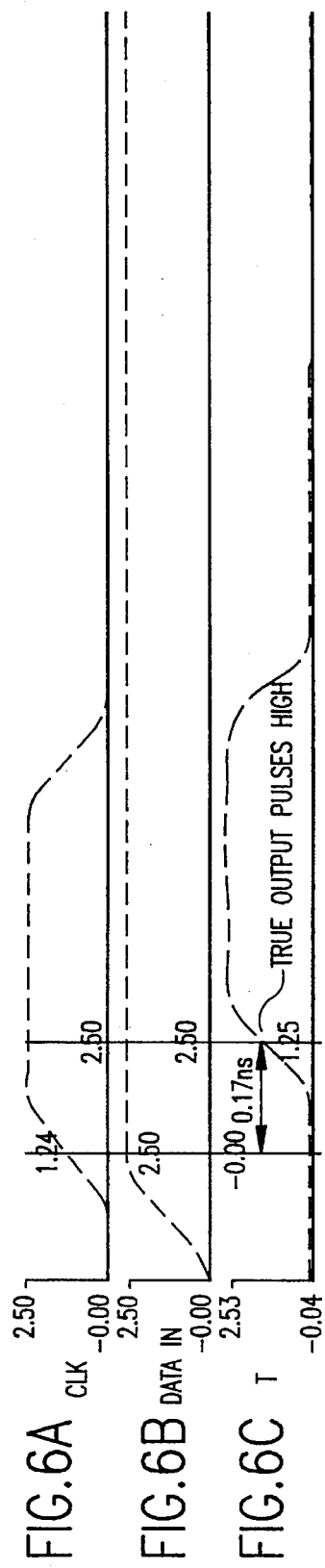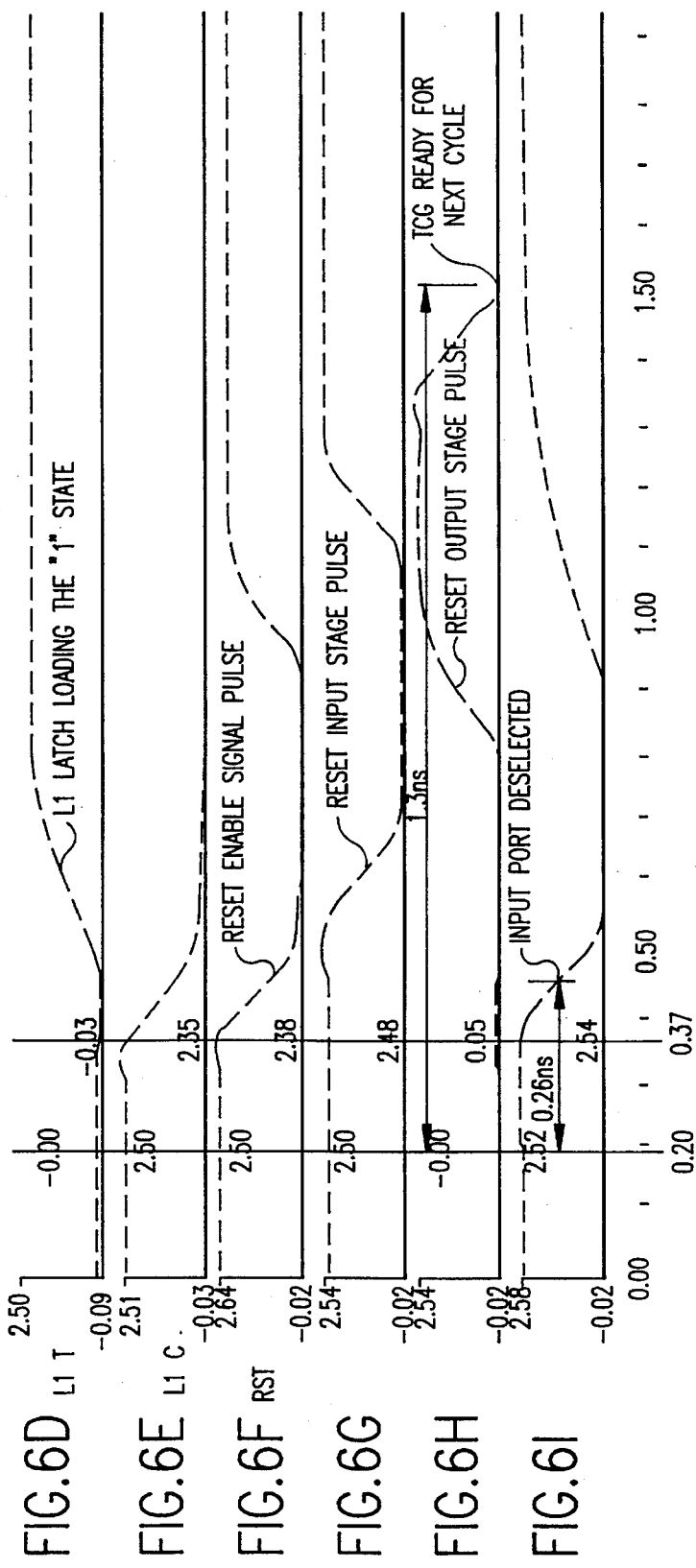

5,576,644

FAST EDGE TRIGGERED SELF-RESETTING CMOS RECEIVER WITH PARALLEL L1/L2 (MASTER/SLAVE) LATCH

CROSS REFERENCE TO RELATED APPLICATION

This application is a divisional of U.S. patent application Ser. No. 08/257,852 filed Jun. 10, 1994, now U.S. Pat. No. 5,465,060, issued Nov. 7, 1995.

BACKGROUND OF THE INVENTION

1. Field of the Invention

The present invention generally relates to high speed receiving and latching and, more particularly, to high speed receiving and latching single-ended signals into a self-resetting CMOS (SRCMOS) circuit.

2. Description of the Prior Art

The main memory portion of modern computers often employ arrays of static random access memory (SRAM) cells, each capable of storing one bit of data. When a bit is read out from a cell, it is normally output to a latch circuit to be held for further processing. Each SRAM cell is typically comprised of a flip-flop having two bit lines, one outputting a logic level indicative of the stored bit and the other outputting its complement. Unfortunately, due to non-ideal conditions or simply when bridging from one logic family to another, the output voltage on either of the bit lines is not necessarily a full logic high or low, but rather something in between which is indefinite to a subsequent reading circuit. This indefiniteness necessitates the use of a separate sensing or receiving circuit to read the SRAM cell to determine the correct logic level of the data bit stored in the SRAM cell. Typically, the logic level is resolved by comparing the SRAM cell bit line to its complement bit line. Once the correct logic level is determined, the data bit is clocked into a latch to be held for further processing. After each cycle the receiver and latch must be reset by the clock to make ready for the next input signal.

U.S. Pat. No. 5,239,506 to Dachtera et al. shows a latch and data out driver for reading a SRAM memory cell as discussed in the preceding paragraph. Dachtera et al. employs a sense amplifier which senses and amplifies a voltage differential across complementary bit lines from a memory cell. Dual outputs from the sense amplifier are fed into a latch driving circuit which in turn is connected to the latch where the actual value of the bit stored in the memory cell is held. For certain applications only a single-ended input or bit line is available as in input to the receiver. Since a complementary bit line is not available for comparison purposes the Dachtera et al. device unsuitable.

U.S. Pat. No. 4,614,885 to Brosch et al. shows a traditional static receiver and latch implemented in a bipolar technology which is capable of receiving a single-ended bit line. However, the Brosch device still relies on a comparison between the input and a reference voltage to determine the value of the input bit. Another major drawback to the Brosch et al. receiver is that it is not edge triggered which means that input data must remain stable the entire time that the clock signal is active. Fluctuations in the input signal during this critical time may result in erroneous data being latched.

SUMMARY OF THE INVENTION

It is therefore an object of the present invention to provide a high speed CMOS receiver for a receiving a data bit from a single-ended input and resolving the logic level of the data bit therefrom.

It is yet another object of the present invention to provide a receiver which is edge triggered such that the data signal received from the single-ended input only has to be present for a short period of time.

It is yet another object of the present invention to provide a CMOS receiver having a self resetting feature which resets as soon as the data bit is resolved.

It is yet another object of the present invention to provide a CMOS receiver and a L1/L2 (master/slave) latch having an additional scannable input port which may be selected for retrieving what is stored in the latch.

According to the invention, a high speed self-resetting, edge-triggered CMOS (SRCMOS) receiver and parallel L1/L2 latch combination are provided which may be used to receive and latch data from a single-ended input of static random access memory (SRAM) or a dynamic random access memory (DRAM). The invention comprises a true/complement generator circuit (TCG) for generating a data and its complement from a single-ended input, a reset circuit for automatically resetting the TCG independent of the system clock, and a parallel L1/L2 latch for storing the data for further processing. The L1/L2 latch preferably has scan-in and scan-out ports useful for testing and diagnostic purposes.

BRIEF DESCRIPTION OF THE DRAWINGS

The foregoing and other objects, aspects and advantages will be better understood from the following detailed description of a preferred embodiment of the invention with reference to the drawings, in which:

FIGS. 6A–6I are logic timing diagrams for the present invention having an output load of 0.6 pf.

DETAILED DESCRIPTION OF A PREFERRED EMBODIMENT OF THE INVENTION

Figure 1:
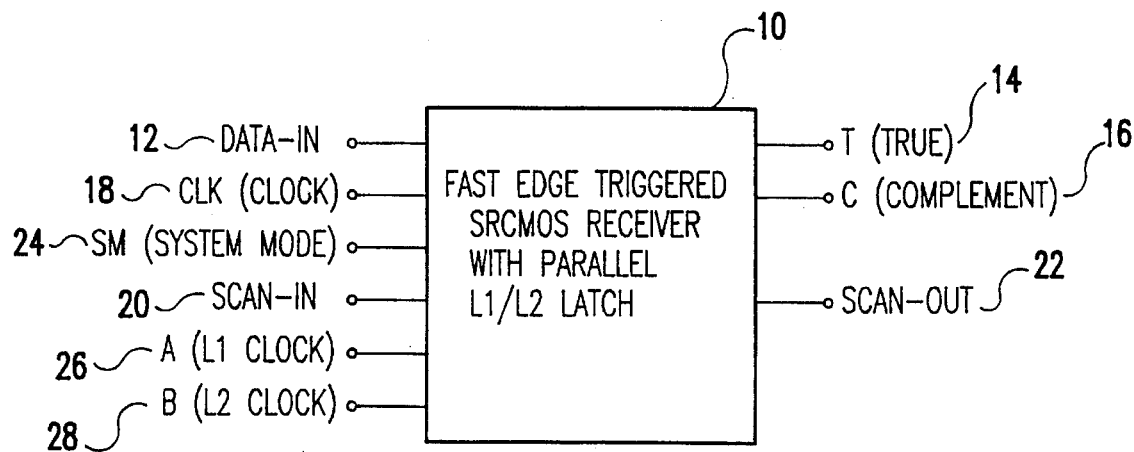
FIG. 1 is a functional block diagram of the high-speed receiving and latching circuit.

Referring now to the drawings, and more particularly to FIG. 1, there is shown the edge-triggered, high-speed receiving and latching circuit of the present invention, generally referred to by the reference numeral 10. The receiver has a dam input port 12 for receiving a single-ended input from, for example, a static or dynamic random access memory, SRAM or DRAM, respectively (not shown). The circuit further includes a true output port 14 for outputting a logic level indicative of a dam bit received from an input signal at the input port 12, a complement output port 16, a clock port 18, for edge trigger clocking dam into the receiver 10 through the data-in port 12, a scan-in port 20, a scan-out port 22, a system mode (SM) port 24, and clock inputs for the L1 and L2 latches labeled clock A (26) and clock B (28), respectively.

Figure 2:
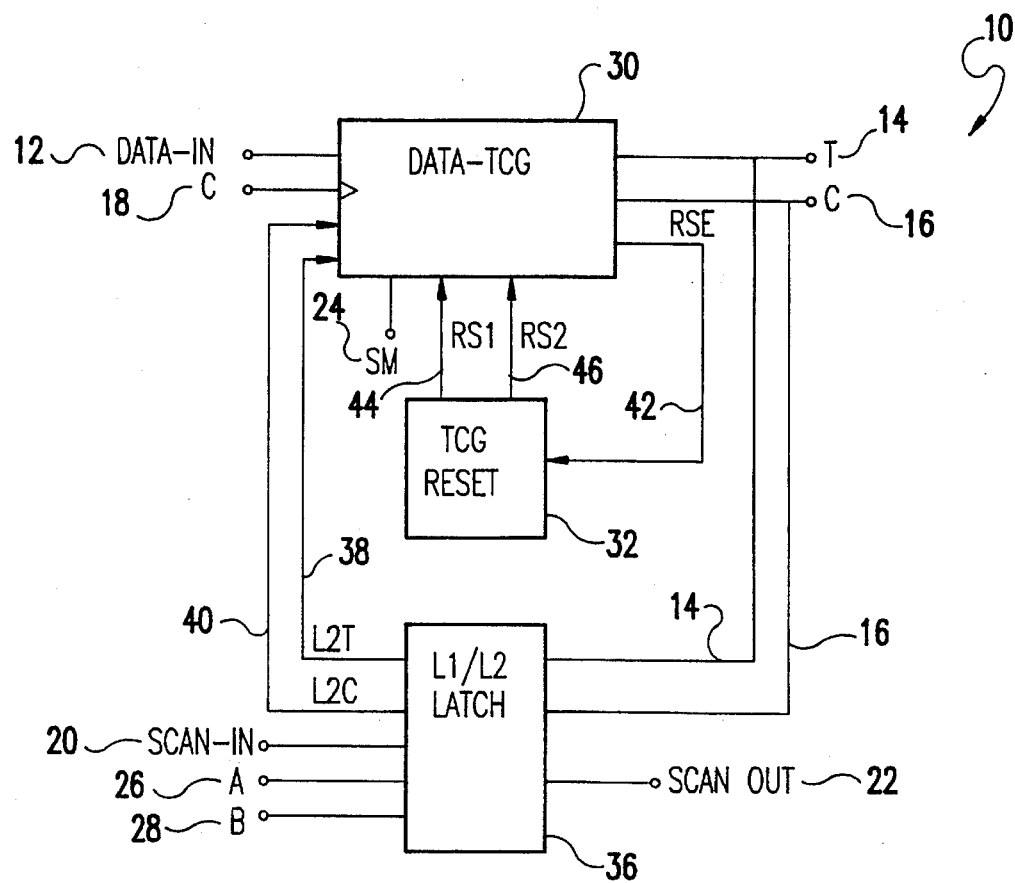
FIG. 2 is a block diagram showing the true/complement generator (TCG), the TCG self-resetting circuit, and the L1/L2 latch.

The circuit shown in FIG. 1 comprises three primary sub-circuits as illustrated in FIG. 2. FIG. 2 shows a data-true/complement generator (TCG) 30, a reset circuit 32, and a L1/12 (master/slave) latch 36. The dam input port 12 of the TCG 30 receives a single-ended input from a memory device. The TCG resolves the logic level of an input signal and generates the full logic level true (T) of the signal and outputs it to the true output port 14. Likewise, the TCG 30 generates a full logic level complement (C) for the input signal and outputs it to complement output port 16. The true and complement outputs (14 and 16, respectively) are directed to the L1/L2 latch 36 where they are clocked into the L1 portion of the L1/L2 latch by clock A 26 to reflect the current states of the true 14 and complement 16 output ports. The contents of L1 may then be clocked by clock B 28 into L2 and feed back to the TCG 30 via latch true and complement outputs, 38 and 40, respectively. Normally, the state of the true and complement output ports, 14 and 16, are determined by the signal received at the data input port 12. However, when the SM input 24 of the TCG 30 is active, the true and complement output ports, 14 and 16, are determined by the state of the L2 latch true and complement outputs, 38 and 40, respectively. Hence, a former data bit and its complement are preserved by the latch 36 and made available to be output by the TCG 30 at a later time for further processing. Preferably the latch circuit 36 is a scannable latch having a scan-in port 20, and a scan-out port 22 for diagnostic purposes.

The SRCMOS receiver of the present invention further includes a resetting circuit 32 which resets the TCG after each data bit is received at data-in port 12 at each clock cycle 18. At the start of each clock cycle 18, both the true and the complement output ports 14 and 16 are held at a logic low. During the rising edge of the clock 18, the data at the data-in port 12 appears at the true output port 14 and its complement at the complement port 14. Either the true port 14 or the complement port 16 must go to a logic high during each cycle causing the reset signal 42 to become active. The TCG reset circuit 32 generates outputs 44 and 46 which reset the TCG 30 causing both true port 14 and complement port 16 to both be reset to a logic low at the end of each cycle.

Figure 3:
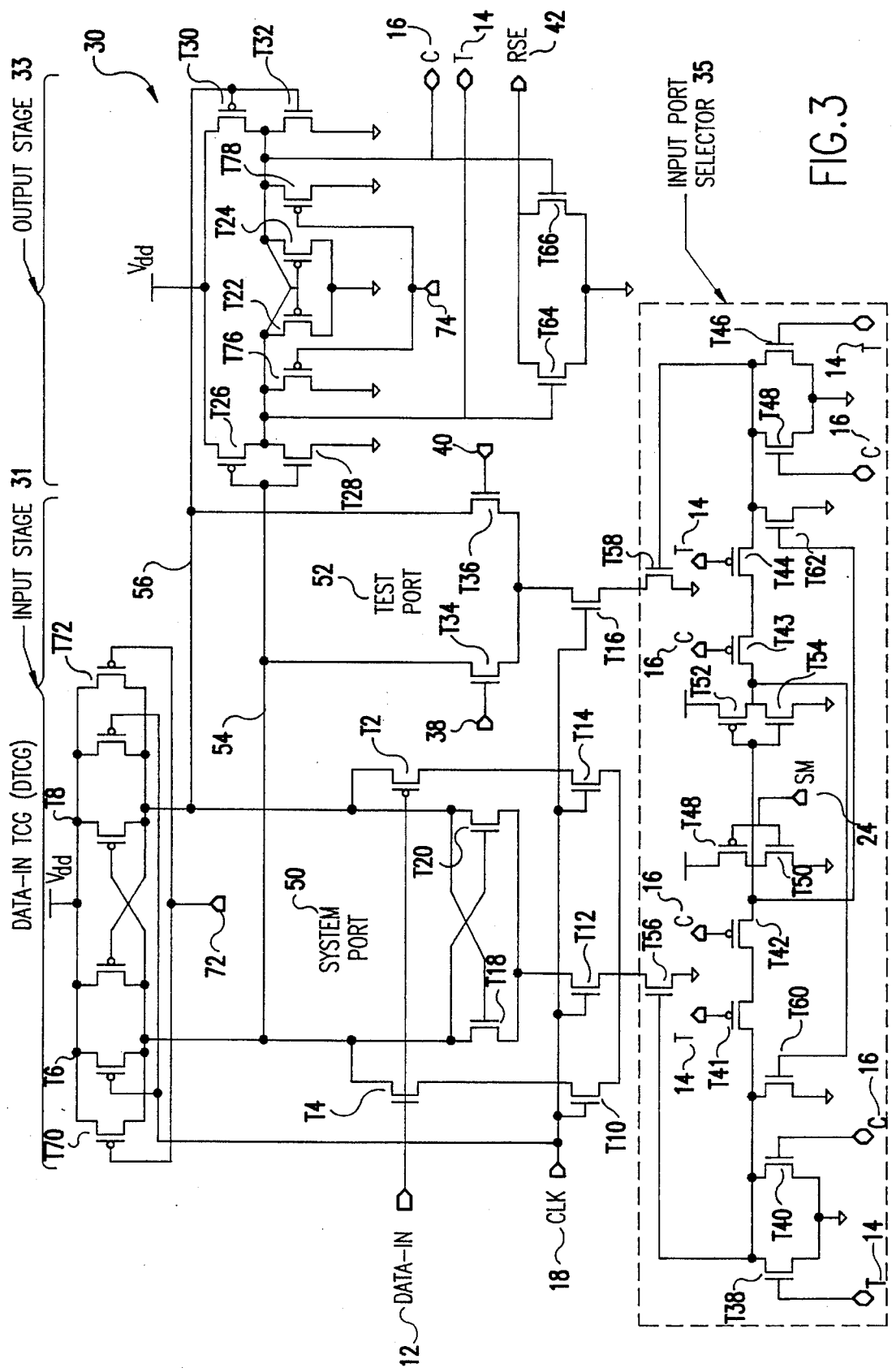
FIG. 3 is a circuit diagram showing the true/complement generator (TCG) circuit.

Referring now to FIG. 3, there is shown a circuit diagram showing the true/complement generator (TCG) 30 shown in FIG. 2. The TCG 30 is designed to receive a data bit from a single-ended signal, determine from the single-ended signal whether the data bit is a logic 1 or a logic 0, and amplify the data to a full logic high or low at the true output 14 and its complement at the complement output port 16. The TCG 30 is comprised of a dynamic input stage 31, an dynamic output stage 33, and an input port selector 35. The input stage 31 has a system port 50 and a test port 52. The system port 50 receives a single-ended input at the data-in port 12 which is fed into a current switch comprised of PFET transistor T2 and NFET transistor T4 which creates a voltage differential when the clock signal 18 is active (high). When the clock signal 18 becomes active, PFET transistors T6 and T8 switch off while NFET transistors T10, T12, T14, and T16 switch on. The cross coupled NFETs, T18 and T20, amplify the voltage differential into a near full logic 1 or 0 depending on the data bit present on the input signal. If the input signal is low, the amplified voltage differential on line 54 is near a full logic 1 and line 56 near a full logic 0. Likewise, if the input signal is high, the amplified voltage differential on line 54 is near a full logic 0 and line 56 near a full logic 1. The test port 52 has a true input 38 at transistor T34 and a complement input 40 at transistor T36. Both inputs 38 and 40 are driven by the L1/L2 latch 36.

The input port selector 35 selects either the system port 50 or the test port 52 to drive the output stage 33 according to the state of the system mode (SM) signal 24. At the beginning of each cycle, both the true 14 and complement 16 output ports are low. Hence, NFET transistors T38, T40, T45, and T46 are in an off state and PFET transistors T41, T42, T43, and T44 are in an on state. When the SM signal 24 is active the output of the CMOS invertor pair T48 and T50 is low thus enabling T56 and the system port 50. Likewise, the output of CMOS invertor pair T52 and T54 is high thus disabling T58 and the test port 52. Similarly, when the SM signal 24 is low, the system port 50 is disabled and the test port 52 is enabled. Transistors T60 and T62 ensure that only one input port (system port 50 or test port 52) is enabled at one time.

The dynamic output stage 33 amplifies the signals on lines 54 and 56 to a full logic 1 or 0 (vdd or ground, respectively) via cross coupled NFETs T22 and T24. Line 54 is input into CMOS invertor pair T26 and T28 the output of which is connected directly to the true output port 14. Line 56 is input into CMOS invertor pair T30 and T32 the output of which is connected directly to complement output port 16. Hence, the full logic true 14 and complement 16 of the input signal 12 are created independently and used to drive the serf reset L1/L2 latch 36. Furthermore, as soon as either the true 14 or the complement 16 output ports pulse high, transistors T38–T46 disable both the system port 50 and the test port 52 on the input stage 31. Hence, since the input stage 31 is edge triggered and immediately disabled thereafter, the and data signals presented for processing need only be present for a short time.

Figure 4:
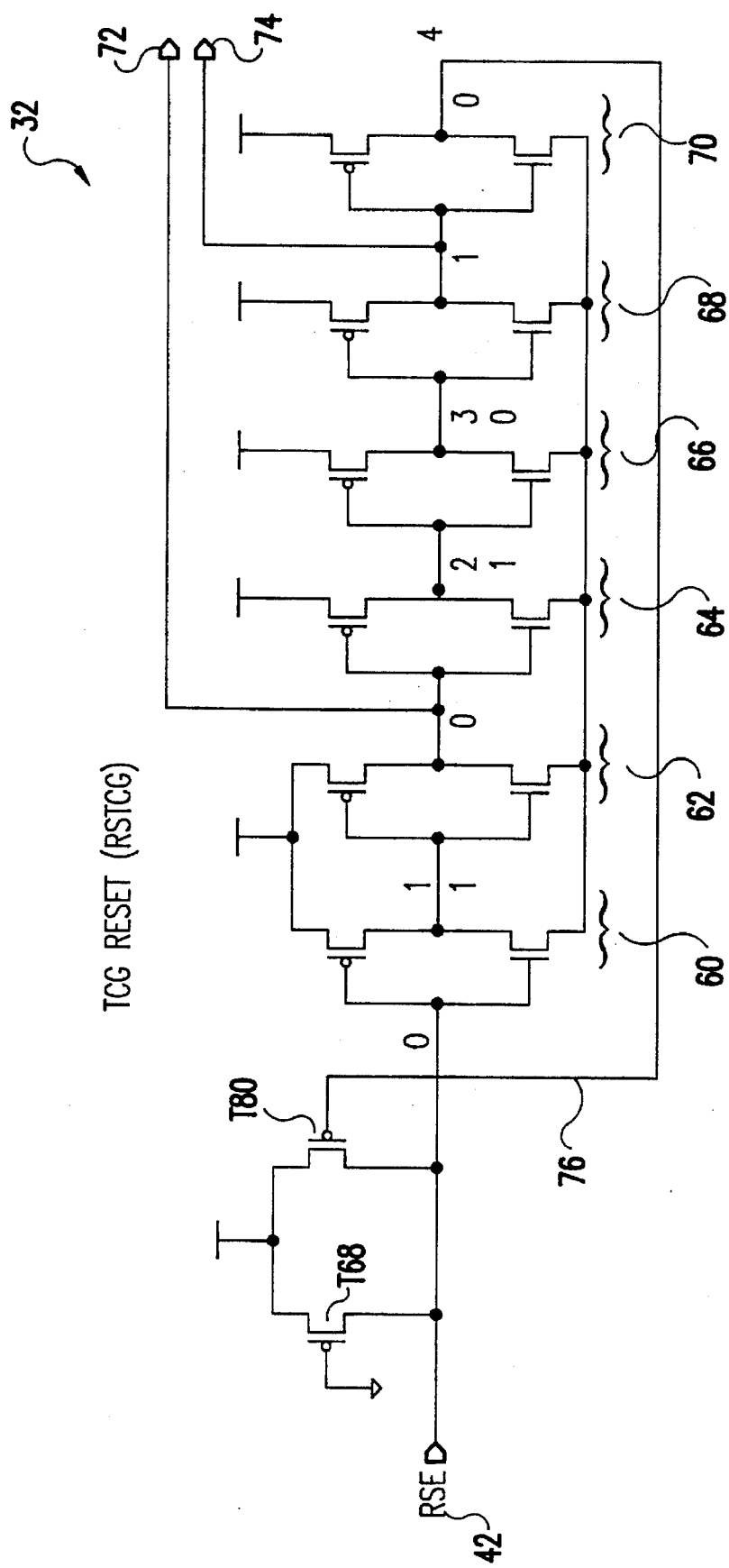
FIG. 4 is a circuit diagram showing TCG self-resetting circuit.

A feature of the present invention includes the self-resetting circuit. An example of a self-resetting circuit block can be found in Terry I. Chappell et al., A 2-ns Cycle, 3.8-ns Access 512-kb CMOS ECL SRAM with a Fully Pipelined Architecture, *IEEE Journal of Solid-State Circuits*, Vol 26, No 11, November, 1991, pp 1577–1585 which is herein incorporated by reference. As shown in FIG. 3, when either the true or complement output port, 14 and 16, pulses high, T64 or T66 pulls the reset signal 42 low, to ground. A schematic of the reset circuit is shown in FIG. 4. The reset circuit of the present invention comprises a series of six CMOS invertor stages 60, 62, 64, 66, 68, and 70. The reset signal 42 is normally held high by transistor T68. Thus input stage reset signal 72 output from invertor 62 is high and the output stage reset signal 74 output from invertor 68 is low. When the reset signal 42 becomes active (low), input stage reset signal 72 output from invertor 62 is pulses low and the output stage reset signal 74 output from invertor 68 pulses high. As shown in FIG. 3, when input stage reset signal 72 is low, PFET transistors T70 and T72 act to reset the input stage. Likewise, when output stage reset signal 74 goes high NFET transistors T76 and T78 reset the output stage by pulling both the true output port 14 and the complement output port 16 low, to ground. Once the reset signal 42 has propagated through all six invertor stages 60, 62, 64, 66, 68, and 70, feedback signal 76 feeds back to T80 to pull the reset signal 42 high again. The self-resetting circuit 32 resets the TCG 30 after each cycle independent of the system clock 18. The self-resetting circuit 32 does not reset the L1/L2 latch 36 so the data clocked into the latch remains stored.

Figure 5:
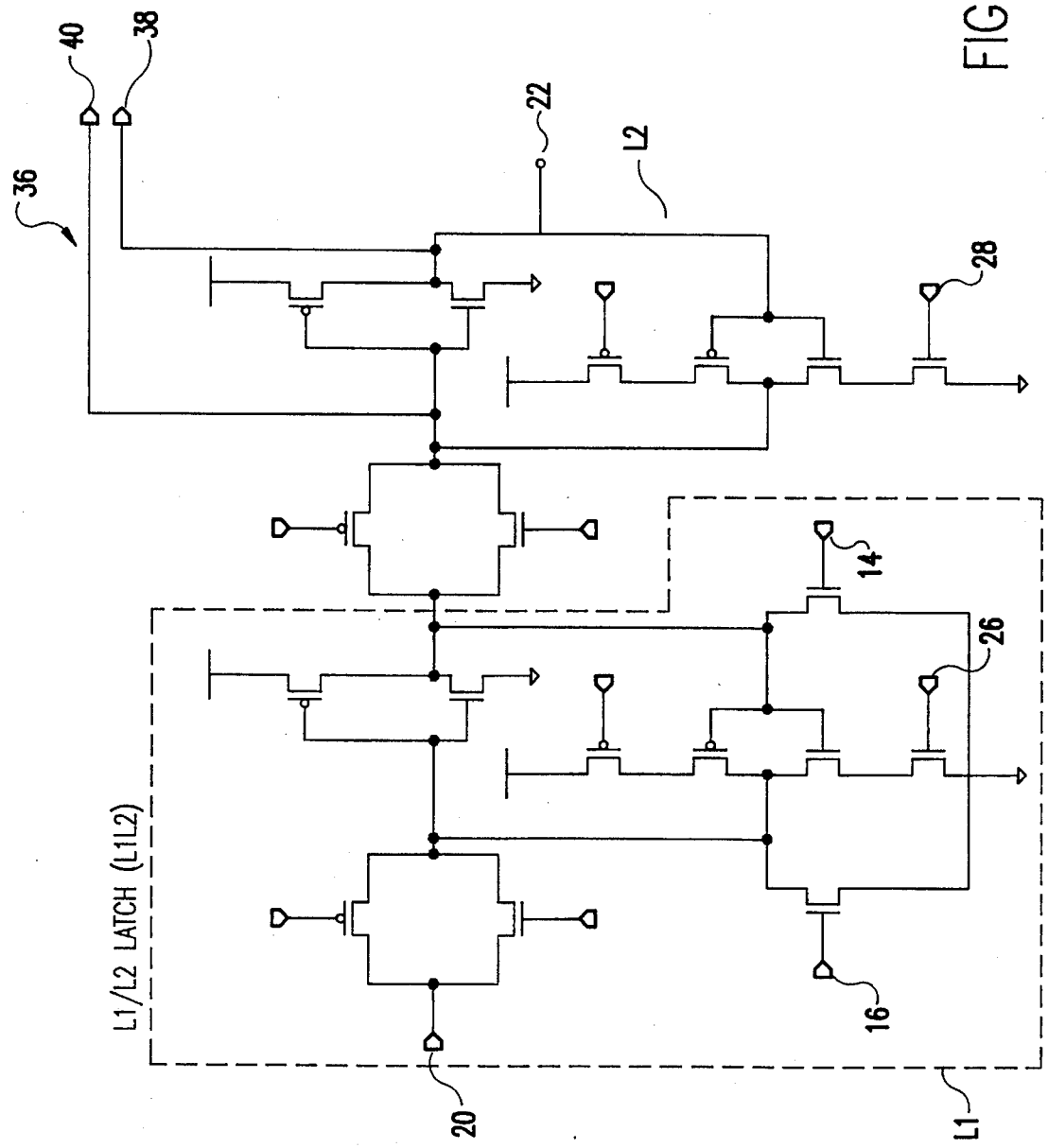
FIG. 5 is a circuit diagram showing a set/reset L1/L2 latch.

FIG. 5 shows a high performance L1/L2 latch used in the preferred embodiment of the present invention. However, it is noted that many configurations of L1/L2 set/reset latches may be used with the novel TCG 30 and self-resetting circuit 32. The latch shown in FIG. 5 is comprised of a master set/reset latch L1 and a slave set/reset latch L2. True 14 and complement 16 data from the TCG 30 are clocked via clock A 26 into L1 at each cycle. Data stored in L1 is then clocked into L2 via clock B 28 to be made reavailable to the TCG test port 52 though L2 true and complement outputs, 38 and 40, respectively. A scan-in port 20 is available for directly driving a test signal into L1. The test signal presented at scan-in port 20 can be clocked through L1 and L2 to appear at scan-out port 22 and is useful for testing and diagnostic purposes.

FIG. 6 is a logic timing diagram for the present invention having an output load of 0.6 pf. FIGS. 6A and 6B show the system clock 18 rising edge and the single data-in signal 12 having a logic bit 1, respectively. It takes about 0.17 ns from the rising edge of the clock for the true output port 14 of the TCG 30 to pulse high as shown in FIG. 6C and, as shown in FIG. 6I, shortly thereafter, the input stage 31 is disabled. FIG. 6D shows L1 loading the true "1" state present at the true output port 14. Similarly, FIG. 6E shows L1 loading the complement "0" state present at the complement output port 16. When the true output rises, FIG. 6C, the TCG reset signal 42 begins to fall as shown in FIG. 6F. As the reset signal propagates through the CMOS invertors 60, 62, 64, 66, 68, and 70 of the self-resetting circuit 32 the input stage reset signal begins to fall (FIG. 6H) and the output stage reset signal begins to rise (FIG. 6I). As can be seen in FIG. 6I the novel self-resetting TCG receiver 30 of the present invention can receive and cycle a data bit in about 1.5 ns. The disabling of the input accomplishes the edge triggering that is required to shorten the hold time of the input signal.

While the invention has been described in terms of a single preferred embodiment, those skilled in the art will recognize that the invention can be practiced with modification within the spirit and scope of the appended claims.

I claim:

1. A method for receiving and generating full logic level true and complement data from a single-ended input signal, comprising the steps of:

receiving an input signal into a first input port on the rising edge of a clock pulse;

generating a voltage differential with a complementary current switch to create a true and a complement data signal for said input signal;

amplifying said true and said complement data signals to full logic levels at an output port;

generating a disable signal to disable said first input port;

generating a first reset signal from said true and complement data signals to reset said first input port; and generating a second reset signal from said true and complement data signals to reset said output port.

2. A method for receiving and generating full logic level true and complement data as recited in claims 1, further comprising the steps of:

receiving true and complement data from a L1/L2 latch into a second input port; and selecting said first or said second input port to drive said output port.

3. A method for receiving and generating full logic level true and complement data from single-ended input signal as recited in claim 2 further comprising the step of holding said true and complement data in said L1/L2 latch throughout the generation of said first reset signal and said second reset signal.

4. A method for receiving and generating full logic level true and complement data from single-ended input signal as recited in claim 2 further comprising the step of holding a data in an L2 portion of said L1/L2 latch when a new data is stored in an L1 portion of said L1/L2 latch.

5. A method for receiving and generating full logic level true and complement data from single-ended input signal as recited in claim 3 wherein said true and complement data is secured in said L1/L2 latch upon said first input port receiving said first reset signal.

6. A method for receiving and generating full logic level true and complement data from single-ended input signal as recited in claim 4, wherein said data held in said L2 portion is undisturbed when said new data is stored in said L1 portion.

7. A method for receiving and generating full logic level true and complement data from single-ended input signal as recited in claim 1, wherein said step of amplifying is performed devoid of a reference voltage.

* * * * *